United States Patent
Ko et al.

(10) Patent No.: US 9,768,305 B2
(45) Date of Patent: Sep. 19, 2017

(54) GRADIENT TERNARY OR QUATERNARY MULTIPLE-GATE TRANSISTOR

(75) Inventors: Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1008 days.

(21) Appl. No.: 12/616,068

(22) Filed: Nov. 10, 2009

(65) Prior Publication Data

US 2010/0301390 A1 Dec. 2, 2010

Related U.S. Application Data (60) Provisional application No. 61/182,550, filed on May 29, 2009.

(51) Int. Cl.
*H01L 31/0304* (2006.01)
*H01L 29/78* (2006.01)
*H01L 29/66* (2006.01)

(52) U.S. Cl.
CPC .... *H01L 29/7851* (2013.01); *H01L 29/66795* (2013.01)

(58) Field of Classification Search
CPC ............... H01L 29/7851; H01L 29/66795
USPC ........................................ 257/190, E31.022
See application file for complete search history.

(56) References Cited

U.S. PATENT DOCUMENTS

| | | | |
|---|---|---|---|
| 5,621,227 A * | 4/1997 | Joshi | 257/184 |
| 6,121,153 A | 9/2000 | Kikkawa | |
| 6,218,685 B1 * | 4/2001 | Nogome | 257/192 |
| 6,399,970 B2 | 6/2002 | Kubo et al. | |
| 6,475,869 B1 | 11/2002 | Yu | |
| 6,475,890 B1 | 11/2002 | Yu | |
| 6,512,252 B1 | 1/2003 | Takagi et al. | |
| 6,635,909 B2 | 10/2003 | Clark | |
| 6,706,571 B1 | 3/2004 | Yu et al. | |
| 6,762,483 B1 | 7/2004 | Krivokapic et al. | |
| 6,858,478 B2 | 2/2005 | Chau et al. | |

(Continued)

FOREIGN PATENT DOCUMENTS

AU    203223306 A1    10/2003
CN    1289149 A    3/2001
(Continued)

OTHER PUBLICATIONS

Merriam-Webster OnLine definition of region, No Date.*
(Continued)

*Primary Examiner* — Hrayr A Sayadian
(74) *Attorney, Agent, or Firm* — Slater Matsil, LLP (57) ABSTRACT

An integrated circuit structure includes a semiconductor substrate; insulation regions over the semiconductor substrate; and an epitaxy region over the semiconductor substrate and having at least a portion in a space between the insulation regions. The epitaxy region includes a III-V compound semiconductor material. The epitaxy region also includes a lower portion and an upper portion over the lower portion. The lower portion and the semiconductor substrate have a first lattice mismatch. The upper portion and the semiconductor substrate have a second lattice mismatch different from the first lattice mismatch.

20 Claims, 5 Drawing Sheets

(56) References Cited

U.S. PATENT DOCUMENTS

| | | | |
|---|---|---|---|
| 6,867,433 B2 | 3/2005 | Yeo et al. | |
| 6,921,963 B2 | 7/2005 | Krivokapic et al. | |
| 6,960,781 B2 | 11/2005 | Currie et al. | |
| 7,042,009 B2 | 5/2006 | Shaheen et al. | |
| 7,045,401 B2 | 5/2006 | Lee | |
| 7,154,118 B2 | 12/2006 | Lindert et al. | |
| 7,190,050 B2 | 3/2007 | King et al. | |
| 7,205,615 B2 | 4/2007 | Tsutsui et al. | |
| 7,247,887 B2 | 7/2007 | King et al. | |
| 7,265,008 B2 | 9/2007 | King et al. | |
| 7,382,021 B2 | 6/2008 | Faulkner et al. | |
| 7,508,031 B2 | 3/2009 | Liu et al. | |
| 7,528,465 B2 | 5/2009 | King et al. | |
| 7,560,784 B2 | 7/2009 | Cheng et al. | |
| 7,598,134 B2 | 10/2009 | Mouli | |
| 7,605,449 B2 | 10/2009 | Liu et al. | |
| 7,683,436 B2 | 3/2010 | Nishiyama et al. | |
| 7,768,079 B2 | 8/2010 | Sandford et al. | |
| 7,928,426 B2 | 4/2011 | Chui et al. | |
| 7,936,040 B2 | 5/2011 | Wu | |
| 7,956,383 B2 | 6/2011 | Kuroda et al. | |
| 7,989,280 B2 | 8/2011 | Brask et al. | |
| 8,058,692 B2 | 11/2011 | Lai | |
| 8,076,231 B2 | 12/2011 | Saitoh et al. | |
| 8,174,073 B2 | 5/2012 | Lee | |
| 8,237,153 B2 | 8/2012 | Chui et al. | |
| 8,314,652 B2 | 11/2012 | Kuo et al. | |
| 8,357,927 B2 | 1/2013 | Jang | |
| 8,399,926 B2 | 3/2013 | Saitoh et al. | |
| 8,440,542 B2 | 5/2013 | Sekar et al. | |
| 8,575,596 B2 | 11/2013 | Pillarisetty et al. | |
| 8,674,408 B2 | 3/2014 | Ko et al. | |
| 2004/0104404 A1 | 6/2004 | Bito | |
| 2005/0029542 A1 | 2/2005 | Mizutani | |
| 2005/0093154 A1 | 5/2005 | Kottantharayil et al. | |
| 2005/0104137 A1 | 5/2005 | Faulkner et al. | |
| 2005/0153490 A1 | 7/2005 | Yoon et al. | |
| 2005/0186742 A1 | 8/2005 | Oh et al. | |
| 2005/0205934 A1 | 9/2005 | Lochtefeld et al. | |
| 2006/0057856 A1 | 3/2006 | Senda et al. | |
| 2006/0076625 A1* | 4/2006 | Lee et al. | 257/353 |
| 2006/0148182 A1 | 7/2006 | Datta et al. | |
| 2006/0292719 A1 | 12/2006 | Lochtefeld et al. | |
| 2007/0102763 A1 | 5/2007 | Yeo et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0238281 A1 | 10/2007 | Hudait et al. | |
| 2007/0243703 A1* | 10/2007 | Pinnington et al. | 438/603 |
| 2008/0105899 A1 | 5/2008 | Kim et al. | |
| 2008/0135879 A1 | 6/2008 | Shin et al. | |
| 2008/0169485 A1 | 7/2008 | Heyns | |
| 2008/0237655 A1 | 10/2008 | Nakabayashi et al. | |
| 2008/0258176 A1 | 10/2008 | Chou et al. | |
| 2008/0290470 A1 | 11/2008 | King et al. | |
| 2008/0296632 A1 | 12/2008 | Moroz et al. | |
| 2008/0315310 A1 | 12/2008 | Rachmady et al. | |
| 2009/0001415 A1 | 1/2009 | Lindert et al. | |
| 2009/0181477 A1 | 7/2009 | King et al. | |
| 2009/0267113 A1 | 10/2009 | Shimoida et al. | |
| 2009/0272965 A1 | 11/2009 | Rachmady et al. | |
| 2010/0252816 A1 | 10/2010 | Ko et al. | |
| 2010/0252862 A1 | 10/2010 | Ko et al. | |
| 2010/0276668 A1 | 11/2010 | Ko et al. | |
| 2010/0301390 A1* | 12/2010 | Ko et al. | 257/190 |
| 2010/0301392 A1 | 12/2010 | Ko et al. | |
| 2012/0001239 A1 | 1/2012 | Ko et al. | |

FOREIGN PATENT DOCUMENTS

| | | | |
|---|---|---|---|
| CN | 1574399 A | 2/2005 | |
| CN | 102244503 A1 | 11/2011 | |
| EP | 0921575 A2 | 6/1999 | |
| EP | 1488462 B1 | 2/2011 | |
| JP | 2005005633 A | 1/2005 | |
| JP | 2005005646 A | 1/2005 | |
| JP | 2005019970 A | 1/2005 | |
| JP | 2005051241 A | 2/2005 | |
| JP | 2005062219 | 3/2005 | |
| JP | 2005521258 A | 7/2005 | |
| JP | 2006516820 A | 7/2006 | |
| JP | 2008508725 A | 3/2008 | |
| JP | 2008141040 A | 6/2008 | |
| JP | 2008160131 A | 7/2008 | |
| JP | 2006521026 A | 9/2008 | |
| JP | 2008270521 A | 11/2008 | |
| JP | 2008546181 A | 12/2008 | |
| JP | 2009105163 A | 5/2009 | |
| KR | 20047012876 | 11/2004 | |
| KR | 2007-0088817 A | 8/2007 | |
| TW | 580771 B | 3/2004 | |
| TW | I269358 | 12/2006 | |
| WO | WO03081640 A2 | 10/2003 | |
| WO | WO2007046150 A1 | 4/2007 | |

OTHER PUBLICATIONS

Merriam-Webster OnLine definition of portion, No Date.*
Chuang, R.W., et al., "Gallium nitride metal-semiconductor-metal photodetectors prepared on silicon substrates," Journal of Applied Physics, vol. 102, 2007, pp. 073110-1-073110-4.
Chui, C.O., et al., "Germanium n-type shallow junction activation dependences," Applied Physics Letters, vol. 87, 2005, pp. 091909-1-091909-3.
Datta, S., et al., "Ultrahigh-Speed 0.5 V Supply Voltage $In_{0.7}Ga_{0.3}As$ Quantum-Well Transistors on Silicon Substrate," IEEE Electron Device Letters, vol. 28, No. 8, Aug. 2007, pp. 685-687.
Iwakami, S., et al., "AlGaN/GaN Heterostructure Field-Effect Transistors (HFETs) on Si Substrates for Large-Current Operation," Japanese Journal of Applied Physics, vol. 43, No. 7A, 2004, pp. L831-L833.
Jackson, S.L., et al., "Silicon Doping of InP, GaAs, $In_{0.53}Ga_{0.47}As$ and $In_{0.49}Ga_{0.51}P$ Grown by Gas Source and Metalorganic Molecular Beam Epitaxy Using a $SiBr_4$ Vapor Source," IEEE, Conference Proceedings, Sixth International Conference on Indium Phosphide and Related Materials, Mar. 27-31, 1994, pp. 57-60.
Krishnamohan, T., et al., "High-Mobility Low Band-To-Band-Tunneling Strained-Germanium Double-Gate Heterostructure FETs: Simulations," IEEE Transactions on Electron Devices, vol. 53, No. 5, May 2006, pp. 1000-1009.
Posselt, M., et al., "P implantation into preamorphized germanium and subsequent annealing: Solid phase epitaxial regrowth, P diffusion, and activation," Journal of Vacuum Science Technology, vol. 26, Jan./Feb. 2008, pp. 430-434.
Satta, A., et al., "Diffusion, activation, and regrowth behavior of high dose P implants in Ge," Applied Physics Letters, vol. 88, 2006, pp. 162118-1-162118-3.
Satta, A., et al., "P implantation doping of Ge: Diffusion, activation, and recrystallization," Journal of Vacuum Science Technology, vol. 24, Jan./Feb. 2006, pp. 494-498.
Shih, C.-F., et al., "Blue, Green, and White InGaN Light-Emitting Diodes Grown on Si," Japanese Journal of Applied Physics, vol. 44, No. 4, 2005, pp. L140-L143.
Vanamu, G., et al., "Growth of high-quality GaAs on $Ge/Si_{1-x}Ge_x$ on nanostructured silicon substrates," Applied Physics Letters, vol. 88, 2006, pp. 251909-1-251909-3.
Vurgaftman, I., et al., "Band parameters for III-V compound semiconductors and their alloys," Journal of Applied Physics, vol. 89, No. 11, Jun. 1, 2001, pp. 5815-5875.
Yamane, Y., et al., "Selective Formation of Ohmic Contacts to n-GaAs," IEEE, Electronics Letters, vol. 23, No. 8, Apr. 9, 1987, pp. 382-383.
Taiwan Office Action for TW Application No. 10220743250, mailed Jun. 2013, 6 pages.

* cited by examiner

GRADIENT TERNARY OR QUATERNARY MULTIPLE-GATE TRANSISTOR

This application claims the benefit of U.S. Provisional Application No. 61/182,550 filed on May 29, 2009, entitled "Gradient Ternary or Quaternary Multiple-Gate Transistor," which application is hereby incorporated herein by reference.

CROSS-REFERENCE TO RELATED APPLICATION

This application relates to commonly-assigned U.S. Provisional Patent Application Ser. No. 61/165,803, filed Apr. 1, 2009, and entitled "High-Mobility Multiple-Gate Transistor with Improved On-to-Off Current Ratio," which application is hereby incorporated herein by reference.

TECHNICAL FIELD

This invention relates generally to integrated circuit devices, and more particularly to fin field-effect transistors (FinFETs) and methods for forming the same.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming NMOS devices due to their high electron mobility. In addition, germanium is a commonly known semiconductor material, and the electron mobility and hole mobility of germanium are greater than that of silicon, which is the most commonly used semiconductor material in the formation of integrated circuits. Hence, germanium is also an excellent material for forming integrated circuits. Therefore, III-V based and germanium-based transistors have been recently explored.

Figure 1:
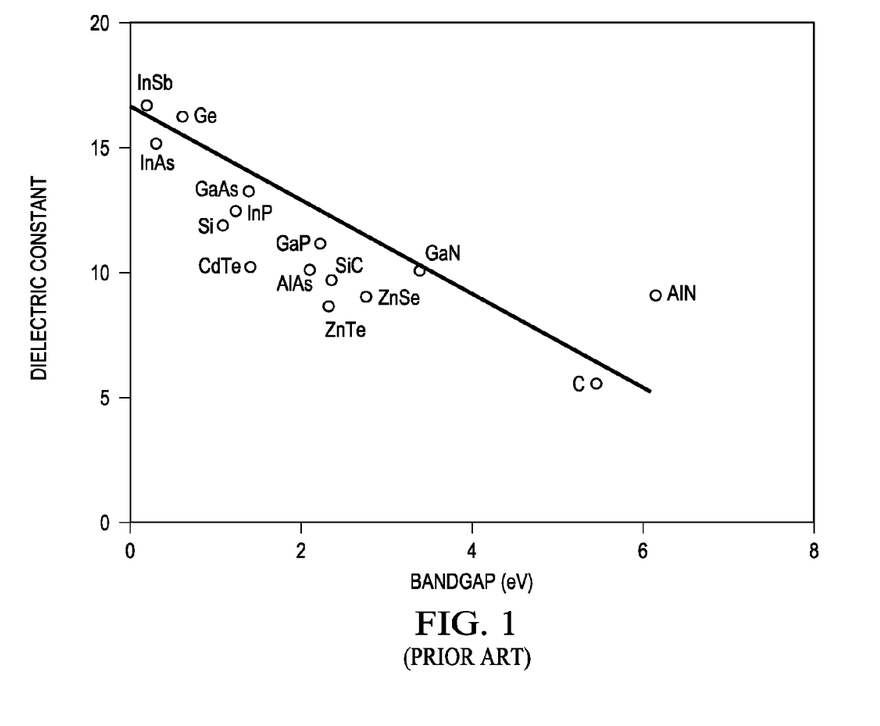
FIG. 1 illustrates bandgaps and dielectric constants of semiconductor materials.

A challenge faced by the semiconductor industry, however, is that although the MOS transistors formed on III-V compound semiconductors or germanium have high drive currents, the leakage currents of these MOS transistors are also high. This is partially caused by the low bandgap and the high dielectric constants of the III-V compound semiconductors and germanium. For example, FIG. 1 illustrates the comparison of bandgaps and dielectric constants of germanium, commonly used III-V compound semiconductors, and other semiconductor materials such as group IV materials. FIG. 1 reveals that the bandgaps of germanium and some commonly used III-V compound semiconductors are small. Therefore, the respective MOS transistors suffer from high band-to-band leakage currents between their gates and source/drain regions. The high dielectric constants of these materials further worsen the leakage currents. As a result, the on/off current ratios (Ion/Ioff) of III-V based MOS transistors and germanium-based MOS transistors are relatively low.

SUMMARY OF THE INVENTION

In accordance with one aspect of the present invention, an integrated circuit structure includes a semiconductor substrate; insulation regions over the semiconductor substrate; and an epitaxy region over the semiconductor substrate and having at least a portion in a space between the insulation regions. The epitaxy region includes a III-V compound semiconductor material. The epitaxy region also includes a lower portion and an upper portion over the lower portion. The lower portion and the semiconductor substrate have a first lattice mismatch. The upper portion and the semiconductor substrate have a second lattice mismatch different from the first lattice mismatch.

Other embodiments are also disclosed.

The advantageous features of the present invention include improved performance in MOS transistors including improved drive currents, reduced leakage currents, and high on-to-off current ratios.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel fin field-effect transistors (FinFETs) and the method of forming the same are presented. The intermediate stages of manufacturing embodiments of the present invention are illustrated. The variations and the operation of the embodiments are discussed. Throughout the various views and illustrative embodiments of the present invention, like reference numbers are used to designate like elements.

Figure 2:
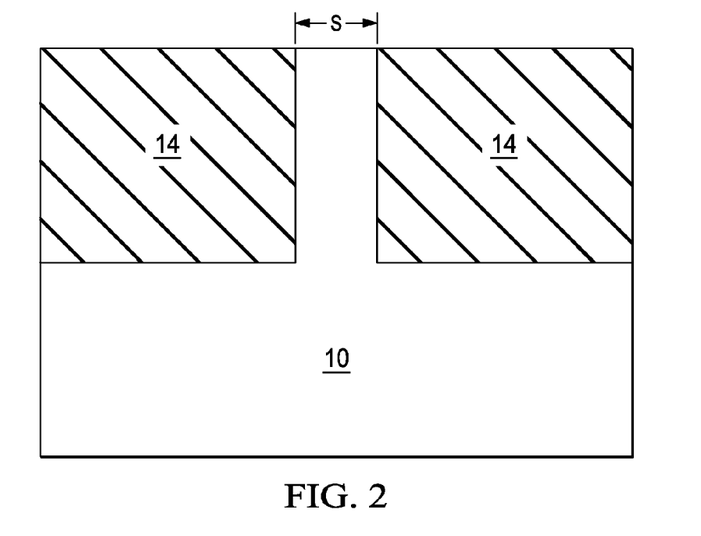
FIGS. 2 through 6 are cross-sectional views of intermediate stages in the manufacturing of a fin field-effect transistor (FinFET) in accordance with an embodiment of the present invention.

FIGS. 2 through 6 illustrate the cross-sectional views of intermediate stages in the manufacturing of a FinFET. Referring to FIG. 2, substrate 10 is provided. Substrate 10 may be a semiconductor formed of commonly used semiconductor materials such as silicon, germanium, SiC, SiGe, GaAs, or the like. Insulation regions such as shallow trench isolation (STI) regions 14 are formed in substrate 10. The formation process of STI regions 14 is known in the art, and hence is not repeated herein. The spacing S between neighboring insulation regions 14 may be small, for example, less than about 50 nm, and may even be less than about 30 nm, although spacing S may be greater. One skilled in the art will realize, however, that the dimensions recited throughout the description are merely examples, and will change if different formation technologies are used.

Figure 3:
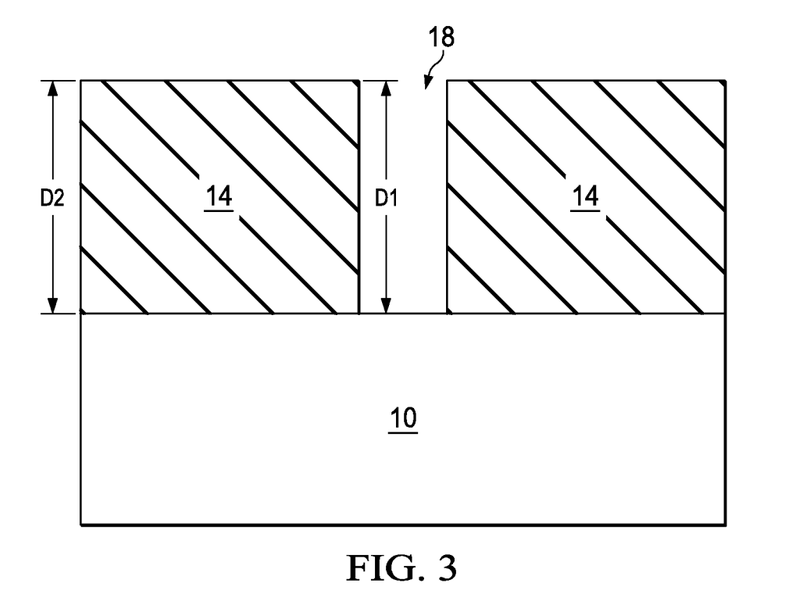

Next, as shown in FIG. 3, the portion of substrate 10 between opposite sidewalls of insulation regions 14 is recessed to form opening 18. Recessing depth D1 may be substantially equal to or less than thickness D2 of insulation regions 14.

Figure 4:
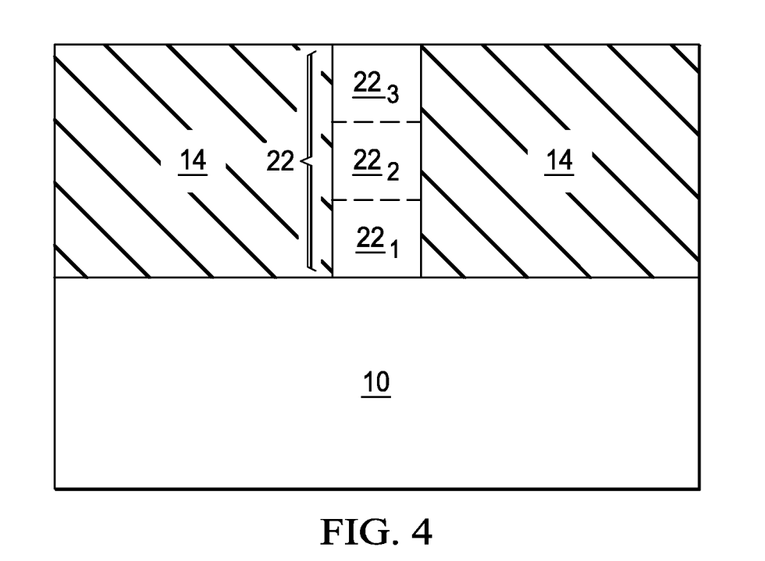

In FIG. 4, semiconductor material 22 is epitaxially grown in opening 18. Semiconductor material 22 may include a material with a high electron mobility such as a III-V compound semiconductor material, which may include, but is not limited to, GaAs, InP, GaN, InGaAs, InAlAs, GaSb, AlSb, AlAs, AlP, GaP, combinations thereof, and multi-layers thereof. In an embodiment, semiconductor material 22 includes a gradient composition, with the compositions of lower portions gradually changed to the desirable composition of upper portions. Also, the bottom portion of semiconductor material 22 may have a lattice constant closer to the lattice constant of substrate 10, while the lattice constant mismatch between semiconductor material 22 and substrate 10 gradually increases from the bottom to the top of semiconductor material 22. In an exemplary embodiment, as schematically illustrated in FIG. 4, the bottom portion $22_1$ is formed of GaAs, while substrate 10 is formed of silicon. The lattice constant of GaAs is greater than that of silicon, with the lattice constant mismatch between GaAs and silicon being about 4 percent. The top portion $22_3$ of semiconductor material 22 may be formed of InGaAs with a composition between that of $In_{0.5}Ga_{0.47}As$ and that of $In_{0.7}Ga_{0.3}As$. If formed of $In_{0.5}Ga_{0.47}As$, the lattice constant of top portion $22_3$ is greater than that of silicon by about 8 percent. The middle portions of semiconductor material 22 have compositions between the composition of bottom portion $22_1$ and the composition of top portion $22_3$. Accordingly, the middle portions of semiconductor material 22 have lattice constants between the lattice constant of bottom portion $22_1$ and the lattice constant of top portion $22_3$. For example, in middle portion $22_2$, the indium percentage increased from bottom to top, with a portion of an exemplary middle portion $22_2$ having a composition $In_{0.2}Ga_{0.8}As$.

In alternative embodiments, bottom portion $22_1$ is formed of germanium, and InGaAs is formed on germanium, with the percentage of indium in InGaAs gradually increasing from lower portions to upper portions, until the desirable composition such as $In_{0.5}Ga_{0.47}As$, $In_{0.7}Ga_{0.3}As$, or a composition therebetween is achieved in top portion $22_3$.

Semiconductor material 22 may have a continuously changed composition, which may be achieved, for example, by continuously adjusting the flow rate of indium-containing gases such as trimethyl indium (TMIn), and/or gallium-containing gases such as trimethyl gallium (TMGa). The composition of semiconductor material 22 may also be layered, with substantially abrupt composition changes from layer to layer. The resulting composition in semiconductor material 22 (either continuously changed or layered) is referred to as a gradient composition.

In the resulting structure, top portion $22_3$ of semiconductor material 22 is formed of a high-mobility III-V compound semiconductor material, which is at least a ternary material including three group III and group V elements. Alternatively, the high-mobility III-V compound semiconductor material further includes an additional group III and group V element to form a quaternary material such as InGaAlAs, InGaAlN, InPAsGa, and the like.

Figure 5:
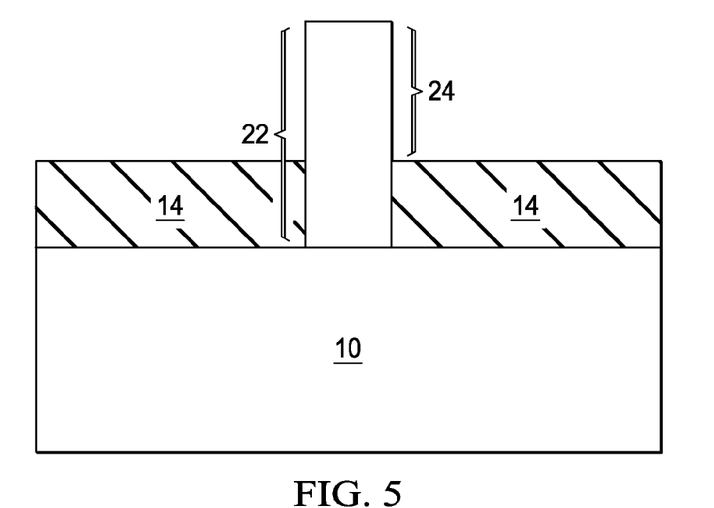

Referring to FIG. 5, the upper portions of insulation regions 14 are selectively etched, while bottom portions are left un-etched. As a result, semiconductor material 22 has a portion standing above the bottom portions of insulation regions 14, thus forming fin 24.

Figure 6:
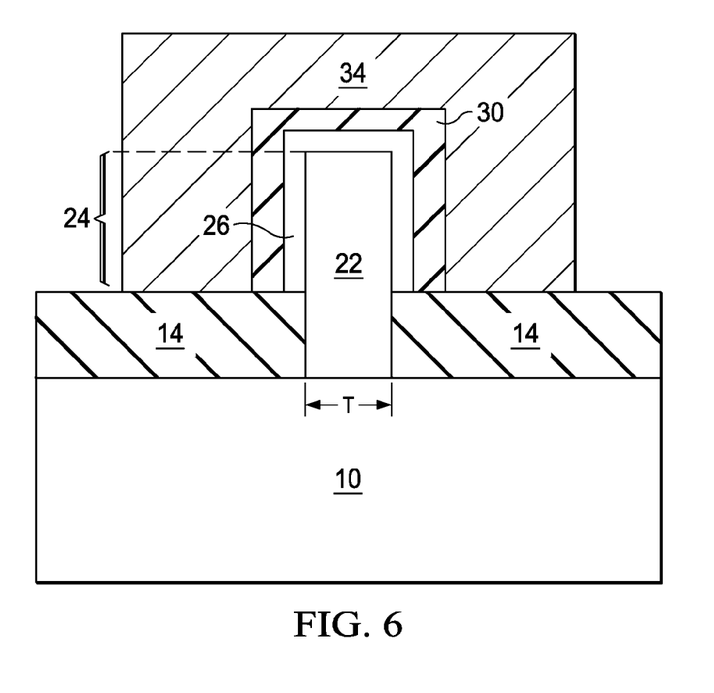

Next, as shown in FIG. 6, high-bandgap semiconductor layer 26 is epitaxially grown. In an embodiment, fin 24 has bandgap EgA, while high-bandgap semiconductor layer 26 has bandgap EgB greater than bandgap EgA. In an exemplary embodiment, bandgap EgB is greater than bandgap EgA by about 0.1 eV, although greater or lower bandgap differences may also apply. Conduction band EcA of fin 24 may also be lower than the conduction band EcB of high-bandgap semiconductor layer 26. In an exemplary embodiment, conduction band EcA is lower than conduction band EcB by about 0.1 eV, although greater or lower conduction band differences may also apply. The appropriate materials of high-bandgap semiconductor layer 26 may be selected by comparing the bandgaps of the available semiconductor materials with high electron mobilities, which may include, but are not limited to, silicon, germanium, GaAs, InP, GaN, InGaAs, InAlAs, GaSb, AlSb, AlAs, AlP, GaP, and the like. In an exemplary embodiment, high-bandgap semiconductor layer 26 comprises GaAs.

The structure shown in FIG. 5 may be used to form a fin field-effect transistor (FinFET). FIG. 6 further illustrates the formation of gate dielectric 30 and gate electrode 34. Gate dielectric 30 may be formed of commonly used dielectric materials such as silicon oxide, silicon nitride, oxynitrides, multi-layers thereof, and combinations thereof. Gate dielectric 30 may also be formed of high-k dielectric materials. The exemplary high-k materials may have k values greater than about 4.0, or even greater than about 7.0, and may include aluminum-containing dielectrics such as $Al_2O_3$, HfAlO, HfAlON, AlZrO, Hf-containing materials such as $HfO_2$, $HfSiO_x$, $HfAlO_x$, $HfZrSiO_x$, HfSiON, and/or other materials such as $LaAlO_3$ and $ZrO_2$. Gate electrode 34 may be formed of doped polysilicon, metals, metal nitrides, metal silicides, and the like. The bottom ends of gate dielectric 30 and gate electrode 34 may contact the top surface of insulation regions 14.

Figure 7:
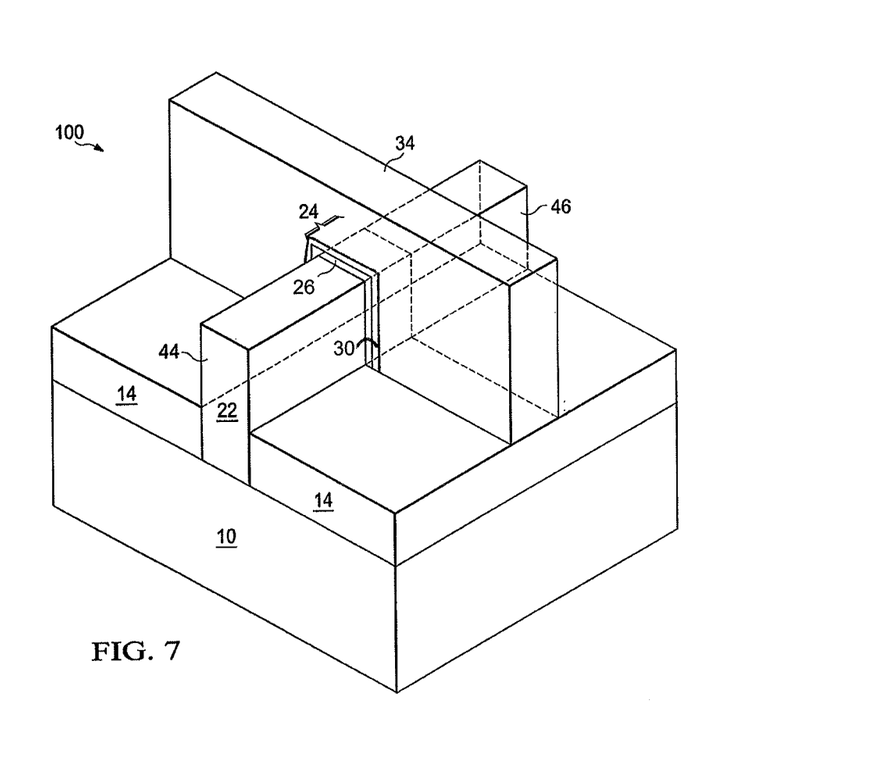
FIG. 7 illustrates a perspective view of the FinFET formed using the steps shown in FIGS. 2 through 6.

After the formation of gate dielectric 30 and gate electrode 34, source and drain regions may be formed. A perspective view of resulting FinFET 100 (which may be an n-type FinFET) is shown in FIG. 7. FinFET 100 includes source region 44, drain region 46, and fin 24 therebetween. FinFET 100 may be an NFET, and source region 44 and drain region 46 are n-type regions doped with an n-type impurity, for example, by implantations. Alternatively, FinFET 100 may be a PFET, and source region 44 and drain region 46 are p-type regions doped with a p-type impurity.

In FinFET 100, with bandgap EgA of fin 24 being lower than bandgap EgB of high-bandgap semiconductor layer 26, fin 24 and the portion of high-bandgap semiconductor layer 26 on opposite sidewalls of fin 24 (refer to FIG. 6) form a quantum well. The quantum effect is partially affected by the thickness T of fin 24 (see FIG. 6), which thickness is equal to spacing S in FIG. 2. When a non-zero gate voltage is applied to gate electrode 34, due to the quantum confinement effect, electrons tend to flow through fin 24. Accordingly, the carrier mobility is high because of the low bandgap EgA, and hence the on-current Ion of the respective FinFET 100 is high. On the other hand, when FinFET 100 is turned off with the gate voltage being zero volts, electrons tend to flow through the high-bandgap semiconductor layers 26. Accordingly, the carrier mobility is low due to the high bandgap EgB, and hence the off-current (leakage current) Ioff of the respective FinFET 100 is low. FinFET 100 thus has a high on/off current ratio.

Figure 8:
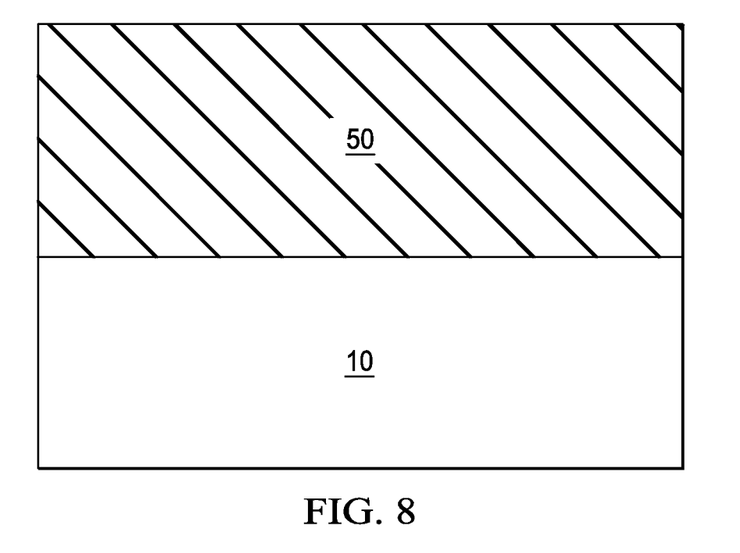
FIGS. 8 and 9 are cross-sectional views of intermediate stages in the manufacturing of a FinFET in accordance with another embodiment.
Figure 9:
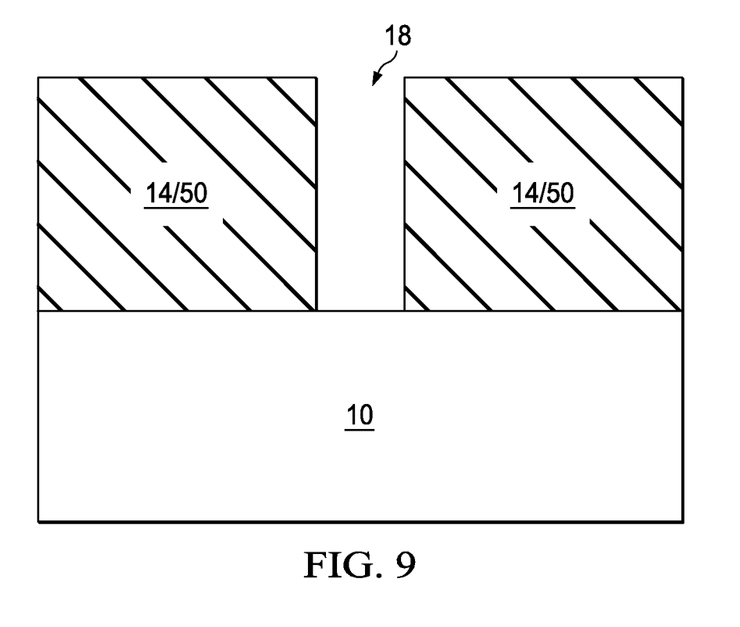

FIGS. 8 and 9 illustrate a second embodiment in accordance with another embodiment. Referring to FIG. 8, semiconductor substrate 10 is provided. Next, mask layer 50 is formed on semiconductor substrate 10. Mask layer 50 may comprise silicon oxide, which may be formed, for example, by thermally oxidizing a top layer of silicon substrate 10. Alternatively, mask layer 50 may also be formed by a deposition method such as one of the chemical vapor deposition methods. The materials of mask layer 50 may include, but are not limited to, silicon nitride, silicon oxynitride, and the like. Mask layer 50 may have a thickness between about 200 nm and about 450 nm.

In FIG. 9, mask layer 50 is patterned, for example by etching, and hence opening 18 are generated. Semiconductor substrate 10 is exposed through opening 18. In this embodiment, the remaining portions of mask layer 50 act as insulation region 14 and have substantially the same function as insulation region 14 as shown in FIGS. 2-6. The remaining steps of this embodiment are substantially the same as the steps illustrated in FIGS. 3-6, and hence are not repeated herein.

The embodiments of the present invention provide low-cost processes for growing high-mobility and low defect III-V compound semiconductor materials by gradually adjusting compositions of the III-V compound semiconductor materials. The transistors formed on the III-V compound semiconductor materials may have increased Ion/Ioff ratios due to the use of small bandgap channels and large bandgap leakage paths.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a semiconductor substrate;
   a insulation layer over the semiconductor substrate; and
   epitaxy layers over the semiconductor substrate, the epitaxy layers having at least a portion extending through the insulation layer, wherein the epitaxy layers comprise a first III-V compound semiconductor material, and wherein the epitaxy layers further comprise:
      a first layer, wherein the first layer is entirely disposed beneath a top surface of the insulation layer, wherein the first layer and the semiconductor substrate have a first lattice mismatch; and
      a second layer over the first layer, wherein an uppermost surface of the second layer extends above the top surface of the insulation layer, wherein the second layer and the semiconductor substrate have a lattice mismatch different from the first lattice mismatch.

2. The integrated circuit structure of claim 1, wherein the epitaxy layers further comprises a portion having continuously changed lattice constants.

3. The integrated circuit structure of claim 1, wherein the epitaxy layers further comprise at least three layers, with lattice constant mismatches between the at least three layers and the semiconductor substrate increasing from lower ones of the at least three layers to upper ones of the at least three layers.

4. The integrated circuit structure of claim 1, wherein the second layer forms a fin, and wherein sidewalls of the fin are vertically aligned to sidewalls of a portion of epitaxy layers lower than the top surface of the insulation layer.

5. The integrated circuit structure of claim 4 further comprising a high-bandgap epitaxy layer on sidewalls of the fin, wherein the high-bandgap epitaxy layer has a second bandgap greater than a first bandgap of the fin.

6. The integrated circuit structure of claim 5, wherein the fin comprises InGaAs, and wherein the high-bandgap epitaxy layer comprises GaAs.

7. The integrated circuit structure of claim 5, wherein the second bandgap is greater than the first bandgap by more than about 0.1 eV.

8. The integrated circuit structure of claim 1, wherein the semiconductor substrate comprises silicon, wherein the epitaxy layers comprise an InGaAs layer, and wherein indium percentages increase from lower portions of the InGaAs layer to upper portions of the InGaAs layer.

9. The integrated circuit structure of claim 8 further comprising a GaAs layer under the lower portions of the InGaAs layer and contacting the semiconductor substrate.

10. The integrated circuit structure of claim 8 further comprising a germanium layer under the lower portions of the InGaAs layer and contacting the semiconductor substrate.

11. The integrated circuit structure of claim 1, wherein the insulation layer comprises shallow-trench isolation (STI) regions.

12. An integrated circuit structure comprising:
    a semiconductor substrate;
    a insulation layer over the semiconductor substrate;
    a fin extending from the semiconductor substrate, the fin extending through and above the insulation layer, the fin comprising a first III-V compound semiconductor material, the fin comprising:
       a first layer having a first lattice constant; and
       a second layer over the first layer, the second layer having a second lattice constant, the first lattice constant being different than the second lattice constant; and
    a gate electrode extending over and along sidewalls of the second layer; and
    a semiconductor layer interposed between the gate electrode and the second layer, the semiconductor layer comprising a different material than the second layer.

13. The integrated circuit structure of claim 12, wherein the fin further comprises a third layer over the second layer, with lattice constant mismatches between the semiconductor substrate and the first layer, the second layer, and the third layer increasing from the first layer to the third layer.

14. The integrated circuit structure of claim 12, wherein the first lattice constant is smaller than the second lattice constant.

15. The integrated circuit structure of claim 12, wherein the second layer comprises a first material layer and a second material layer, the first material layer being interposed between the second material layer and the first layer, the first material layer and the second material layer being formed of same elements, the first material layer and the second material layer having different percentages of at least two of the elements.

16. The integrated circuit structure of claim 15, wherein the first material layer and the second material layer comprise indium, gallium, and arsenic, the first material layer having a lower percentage of indium than the second material layer.

17. An integrated circuit structure comprising:
a semiconductor substrate;
a insulation layer over the semiconductor substrate;
a fin over the semiconductor substrate, the insulation layer extending along opposing sidewalls of the fin, the fin comprising a first III-V compound semiconductor material, the fin comprising:
   a first layer, the first layer and the semiconductor substrate having a first lattice mismatch; and
   a second layer over the first layer, the second layer and the semiconductor substrate have a second lattice mismatch, the first lattice mismatch being different than the second lattice mismatch; and
a gate electrode extending over and along sidewalls of the fin.

18. The integrated circuit structure of claim 17, further comprising a high-bandgap epitaxy layer on sidewalls of the fin, wherein the high-bandgap epitaxy layer has a second bandgap greater than a first bandgap of the fin.

19. The integrated circuit structure of claim 17, wherein the first layer comprises a GaAs layer.

20. The integrated circuit structure of claim 19, wherein the second layer comprises a first InGaAs layer and a second InGaAs layer over the first InGaAs layer, wherein the first InGaAs layer has a lower percentage of indium than the second InGaAs layer.

* * * * *